(12) United States Patent
Obweger et al.

(10) Patent No.: US 8,833,380 B2
(45) Date of Patent: Sep. 16, 2014

(54) DEVICE FOR TREATING DISC-LIKE ARTICLES

(75) Inventors: Rainer Obweger, Lind Im Drautal (AT); Franz Kumnig, Lieserbrucke (AT); Thomas Wirnsberger, Seeboden (AT)

(73) Assignee: Lam Research AG, Villach (AT)

( * ) Notice: Subject to any disclaimer, the term of this patent is extended or adjusted under 35 U.S.C. 154(b) by 0 days.

(21) Appl. No.: 13/217,808

(22) Filed: Aug. 25, 2011

(65) Prior Publication Data

US 2011/0304107 A1 Dec. 15, 2011

Related U.S. Application Data

(62) Division of application No. 13/133,277, filed as application No. PCT/IB2010/051315 on Mar. 25, 2010.

(30) Foreign Application Priority Data

Mar. 31, 2009 (AT) .................................. A 512/2009

(51) Int. Cl.
*B23B 31/16* (2006.01)
*H01L 21/687* (2006.01)

(52) U.S. Cl.
CPC .... *H01L 21/68707* (2013.01); *H01L 21/68728* (2013.01)
USPC ............. 134/157; 134/94.1; 134/137; 279/60

(58) Field of Classification Search
USPC .............................. 134/94.1, 137, 157; 279/60
See application file for complete search history.

(56) References Cited

U.S. PATENT DOCUMENTS 4,856,456 A * 8/1989 Hillman et al. ............... 118/500
5,168,886 A   12/1992 Thompson
5,818,137 A * 10/1998 Nichols et al. ............... 310/90.5

(Continued)

FOREIGN PATENT DOCUMENTS

EP    0989594 A2    3/2000
EP    0989594 A3    1/2005

(Continued)

OTHER PUBLICATIONS

Extended European Search Report, dated Dec. 17, 2013, from corresponding EP application.

(Continued)

*Primary Examiner* — Michael Barr
*Assistant Examiner* — Benjamin L Osterhout
(74) *Attorney, Agent, or Firm* — Young & Thompson

(57) ABSTRACT

A device for treating a disc-like article with a fluid, including elements for dispensing a fluid onto the article and a chuck for holding and rotating the article around an axis perpendicular thereto, the chuck including a base body, a drive ring, and gripping members for contacting the article at its edge. The gripping members are eccentrically movable with respect to the center of the article and driven by a drive ring rotatably mounted to the base body so that the drive ring is rotatable against the base body around the axis. The relative rotational movement of the drive ring against the base body is carried out by either holding the base body and rotating the drive ring or by holding the drive ring and rotating the base body, whereby the to-be-held-part (drive ring or base body) is held without touching the respective to-be-held-part by magnetic force.

11 Claims, 6 Drawing Sheets

(56) References Cited

U.S. PATENT DOCUMENTS

| | | | |
|---|---|---|---|
| 5,845,662 A | 12/1998 | Sumnitsch | |
| 6,049,148 A * | 4/2000 | Nichols et al. | 310/68 B |
| 6,190,057 B1 | 2/2001 | Osaka et al. | |
| 6,222,339 B1 | 4/2001 | Yamasaki et al. | |
| 6,427,824 B1 | 8/2002 | Murata et al. | |
| 6,485,531 B1 | 11/2002 | Schoeb | |
| 6,761,362 B2 * | 7/2004 | Noguchi | 279/106 |
| 7,210,991 B1 | 5/2007 | Van Der Veen et al. | |
| 8,293,071 B2 | 10/2012 | Lee | |
| 2002/0066475 A1 * | 6/2002 | Verhaverbeke et al. | 134/153 |
| 2004/0151562 A1 * | 8/2004 | Hofmeister et al. | 414/217 |
| 2006/0054082 A1 | 3/2006 | Okuno et al. | |
| 2006/0137719 A1 | 6/2006 | Hasegawa et al. | |
| 2008/0127888 A1 | 6/2008 | Kim et al. | |

FOREIGN PATENT DOCUMENTS

| | | |
|---|---|---|
| JP | 10-092912 | 4/1998 |
| JP | H1111860 A | 1/1999 |
| JP | H11354617 A | 12/1999 |
| JP | H10508157 A | 6/2000 |
| JP | 2004-111902 | 4/2004 |
| JP | 2006086222 A | 3/2006 |
| JP | 2008103701 A | 5/2008 |
| JP | 2008119642 A | 5/2008 |
| KR | 100873153 B1 | 12/2008 |
| KR | 10-2009-0132966 | 12/2009 |
| WO | 2007/101764 | 9/2007 |
| WO | 2008008921 A2 | 1/2008 |
| WO | 2008008921 A3 | 1/2008 |

OTHER PUBLICATIONS

Extended European Search Report, dated Jan. 3, 2014, from corresponding EP application.

Translation of Japanese Office Action, dated Feb. 4, 2014, from corresponding JP application.

* cited by examiner

US 8,833,380 B2

DEVICE FOR TREATING DISC-LIKE ARTICLES

TECHNICAL FIELD

The invention refers to a device for supporting and rotating a disc-like article with a rotor comprising a support for supporting the disc-like article, wherein the rotor is located within a process chamber.

BACKGROUND ART

WO 2007/101764 A1 discloses a device for fluid treatment of a disc-like article comprising a rotary head for holding and rotating a disc-like article around a rotation axis, a drive means to suspend and drive the rotary head without contact, the drive means being arranged radially around the rotary head, a substantially cylindrical wall, which is substantially concentric to the rotation axis, wherein the cylindrical wall is arranged between the rotary head and the drive means.

A suitable driving mechanism is described in U.S. Pat. No. 6,485,531. With the herein disclosed active magnetic bearing and drive mechanism the distance of stator to rotor is limited.

Some solutions of holding the disc-like article are provided in U.S. Pat. No. 5,845,662. These holding means are however complicated to open or require a minimum spin speed in order to securely hold the disc-like article. Another problem is that at very high spin speeds they may hold the disc-like article with a force that could be high enough to harm the disc-like article.

It is an object of the invention to provide a device which securely holds a disc-like article during treatment.

DISCLOSURE OF INVENTION

The invention solves the problems by providing a device for treating a disc-like article comprising a chuck for holding and rotating the disc-like article about an axis A perpendicular to the disc-like article, wherein the chuck comprises a base body, a drive ring, which is rotational symmetrical arranged to the base body, and gripping members for contacting the disc-like article at its edge, wherein the gripping members can be moved eccentrically with respect to the axis A by twisting the drive ring relative to the base body about the axis A, wherein the drive ring is held by magnetic forces.

Such a configuration is especially helpful if the chuck is held and rotated by magnetic bearings (e.g. active magnetic bearings as described in U.S. Pat. No. 6,485,531 or WO2007/101764A1). However, such a mechanism can also be used in combination with an ordinary chuck driven by a spindle.

In one embodiment the device comprises dispensing means for dispensing a fluid onto the disc-like article and a chuck for holding and rotating a disc-like article about an axis A perpendicular to the disc-like article, the chuck comprising a base body, a drive ring, and gripping members for contacting the disc-like article at its edge, wherein the gripping members are eccentrically movable with respect to the centre of the disc-like article, wherein the eccentric movement of the gripping members is driven by a drive ring, wherein the drive ring is rotatable mounted to the base body, so that the drive ring is rotatable against the base body around the axis A and thereby driving the gripping members, wherein the relative rotational movement of the drive ring against the base body is carried out by either holding the base body and rotating the drive ring or by holding the drive ring and rotating the base body, whereby the to-be-held-part (drive ring or base body) is held without touching the respective to be held part by magnetic force. In this case the to-be-rotated-part (base body or driving ring respectively) can be rotated without touching the respective to-be-rotated-part by magnetic force.

Such magnetic force typically is established between two elements of a magnetic couple. Such couples can e.g. be one of the following:

2 permanent magnets—the first magnet fixed to the drive ring; the second magnet mounted to a moving member, which can be radially moved (radially with respect to the axis A). Such a moving member can be driven e.g. by a pneumatic cylinder or an electric linear motor.

one permanent magnet and one electromagnet—the first magnet fixed to the drive ring; the electromagnet mounted to a non-rotating part of the device (e.g. the chamber wall)

In another embodiment the base body is formed as a hollow ring with an annular chamber accommodating the drive ring. Such hollow ring may comprise two or more parts. Such parts can be welded, screwed or glued together.

Preferably the chuck is magnetically levitated. This can be carried out by an active magnetic bearing (as described in U.S. Pat. No. 6,485,531) or by a bearing supported by high temperature superconducting magnets. Such a driving mechanism comprising high temperature superconducting magnets is further described by published patent applications deriving from Austrian patent application no. A 1987/2008. With such a configuration it is possible that all parts of the spin mechanism as well as all parts of the gripping mechanism can be sealed against treatment fluids. The parts for activating the opening/closing mechanism can be located outside a closed process chamber.

In one embodiment the drive ring is a gear ring and the gripping members are cams eccentrically projecting for smaller gears (eccentric with respect to the rotation axis of the smaller gears), which are driven by the gear ring. When the gear ring is twisted against the base body the smaller gears rotate and therewith the cams (pins), which project eccentrically from the smaller gears, alter their distance to the axis A. Thereby the cams grip the disc-like article at its edge or release the disc-like article. It shall be understood that the projecting cams can either be mounted to the smaller gears or that the cams and the smaller gears can be formed out of the same piece of material.

Preferably the drive ring is held in standby position by an elastic member (e.g. a spring), whereby the gripping members are urged into closed position. When the drive ring is held by magnetic forces and the base body is twisted the drive ring is spanned against the chucking power. Then the disc-like article is placed between the gripping members. Thereafter the drive ring and base body are twisted back again and the gripping members contact the disc-like article's edge. Consequently the force of the elastic member securely chucks the disc-like article.

In a preferred embodiment the device further comprises a wall surrounding the chuck and during treating the disc-like article the chuck is freely levitated within the wall. In this case the elements, between which the magnetic force shall be established, have to be configured so that the drive ring can be securely locked while the base body of the chuck is turned about a certain angle (e.g. 1°-10°).

In a preferred embodiment the wall surrounding the chuck is part of a closed chamber. This has the advantage that the chuck and therewith the disc-like article rotate within the chamber whereas the mechanisms for driving the chuck and for opening the gripping members remain outside the chamber. The chamber needs to be opened only for entering and exiting the disc-like article.

In another embodiment dispensing means are provided for unobstructed dispensing of fluids onto both sides of the disc-like article. This is helpful if the dispensed fluids comprise liquids.

MODE(S) FOR CARRYING OUT THE INVENTION

With reference to FIG. 2a-2f a device 200 according to one embodiment of the invention shall be described.

Figure 2A:
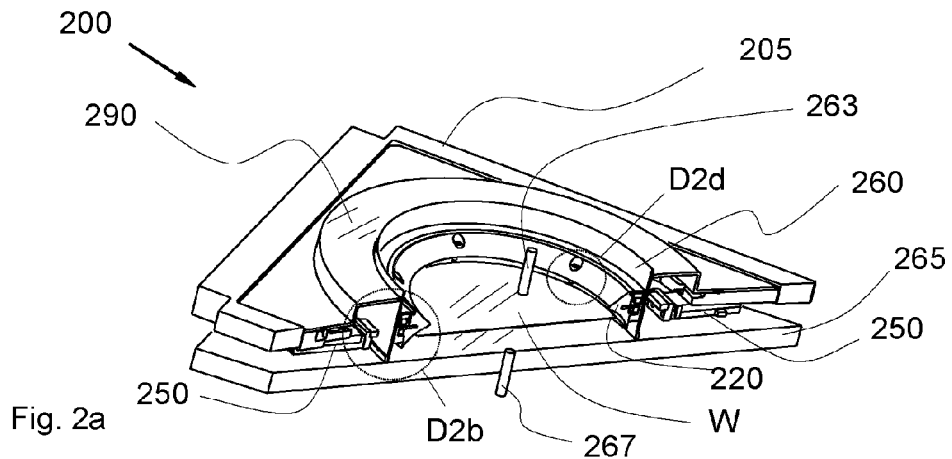
FIG. 2a-2f show different views of a device according to one embodiment of the invention.

FIG. 2a shows a cross-sectional perspective view of a device 200 according to one embodiment of the invention.

Figure 2B:
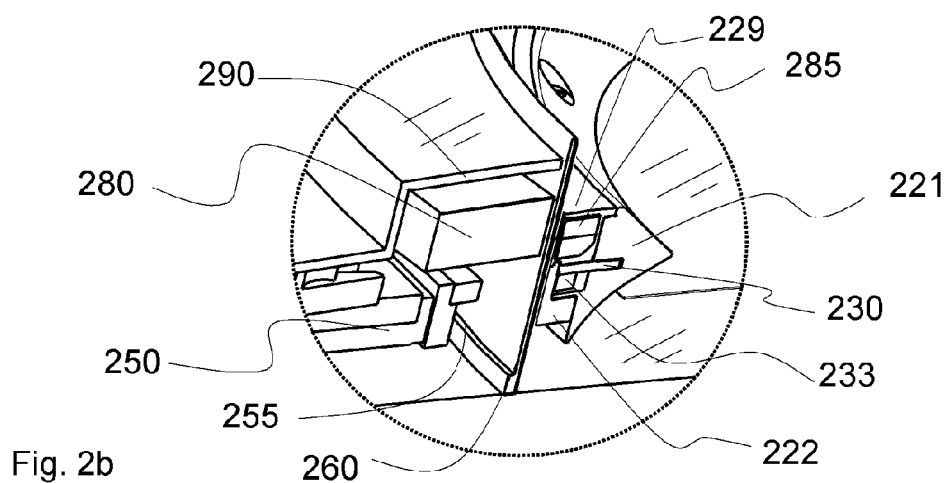

FIG. 2b shows an enlarged view of the detail D2b (of FIG. 2a).

Figure 2C:
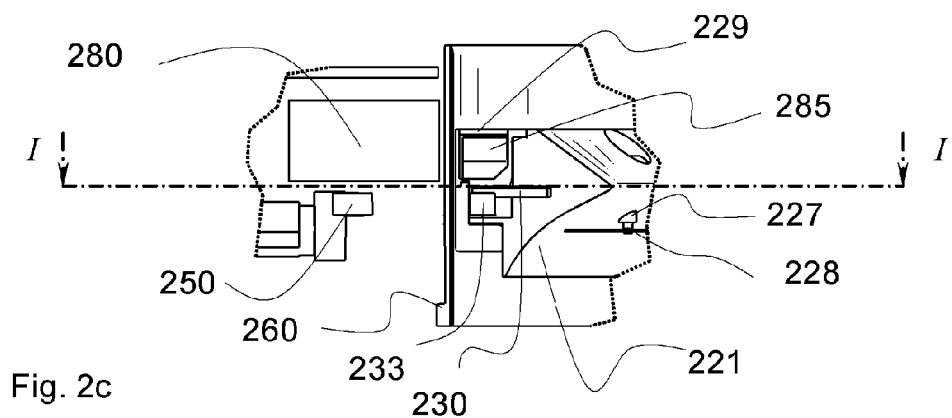

FIG. 2c shows a side view of the detail D2b.

Figure 2D:
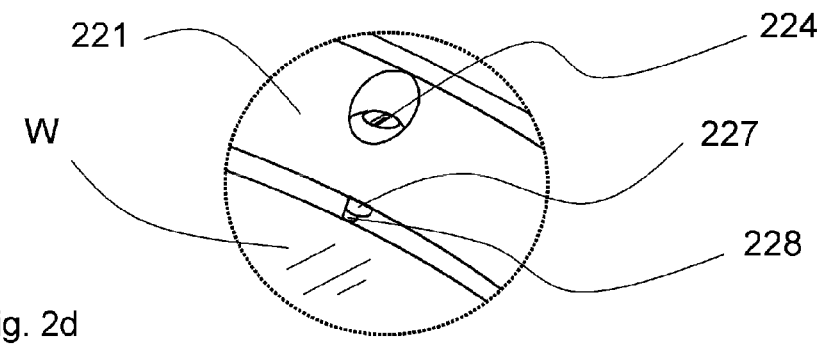

FIG. 2d shows an enlarged view of the detail D2d (of FIG. 2a).

Figure 2E:
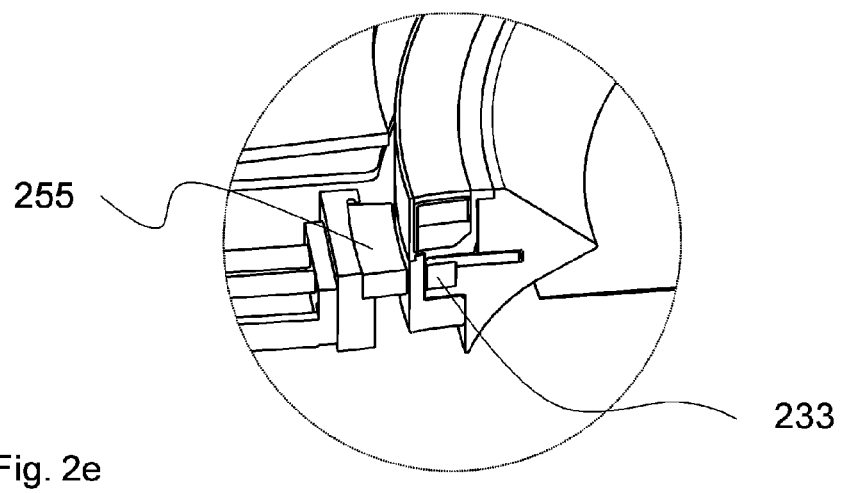

FIG. 2e shows the same view as FIG. 2b however the permanent magnet 255 for locking the tooth gear ring are brought into close proximity to the permanent magnets 233 of the chuck.

Figure 2F:
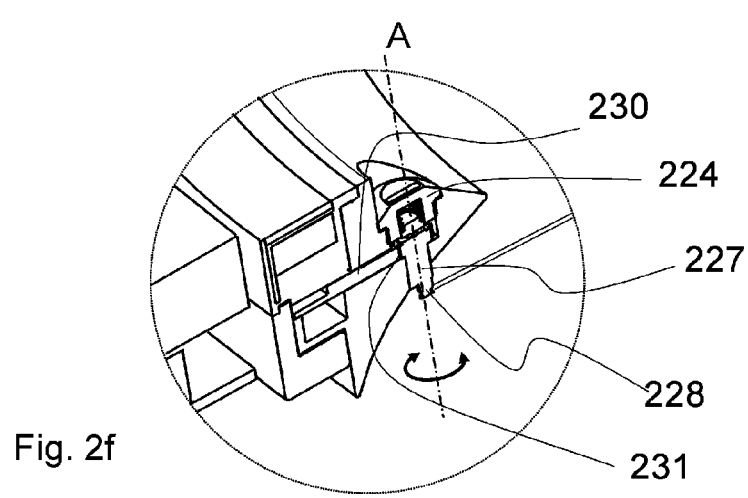

FIG. 2f shows an enlarged detail of a cross-sectional perspective view through the pin shaft 227 and the pin 228.

The device 200 comprises a chamber, an annular chuck 220 for gripping and rotating a wafer (disc-like article) and a stator 280.

The chamber comprises a cylindrical wall 260, a bottom plate 265 and a top plate (not shown). An upper dispensing tube 263 is lead through the top plate and a lower dispensing tube 267 through the bottom plate 265.

The stator 280 is mounted to a stator base plate 205 concentric to the cylindrical wall 260. The stator base plate 205 can be moved in axial direction with respect to the cylinder axis of the cylindrical wall 260, e.g. with pneumatic lifting means. The stator base plate 205 and the stator 280 mounted thereto have central openings, which have bigger diameter than the outer diameter of the cylindrical wall 260. The top plate can also be moved in axial direction in order to open the chamber. In closed position the top plate is sealed against the cylindrical wall.

The stator 280 comprises several coils for axial and radial bearing and for driving the rotor 285, which is part of the annular chuck. Such arrangement is called active bearing and is further described in U.S. Pat. No. 6,485,531.

The diameter of the annular chuck 220 is smaller than the inner diameter of the cylindrical wall so that it can freely levitate and rotate within the cylindrical wall 260. The annular chuck 220 comprises an inner chuck base body 221 with an annular groove circumferentially surrounding the outside of the inner chuck base body 221, the annular groove serves as the bearing for the drive ring 230.

The drive ring 230 is embodied as a gear ring 230 with inwardly facing teeth 231. The inwardly facing teeth 231 drive the teeth of a pin shaft 227 (see FIG. 2f).

This embodiment has six downwardly oriented pin shafts 227, each of which has a small gear, which is driven by the drive ring 230. The pin shafts 227 are mounted so that they can turn about an axis A, which is parallel to the rotation axis of the annular chuck.

Eccentric with respect to the pin shaft's rotation axis A a pin 228 is mounted to the pin shaft 227 so that the pin alters its distance to the centre of the annular chuck when the pin shaft is turned by the drive ring 230. In other words the pin is radially moved when the drive ring 230 is twisted against the chuck base body 221. In order to mount the drive ring 230 into the annular groove of the chuck base body 221 the drive ring 230 consists of two separate segments, which are fixed together when inserted into the annular groove. The chuck base 221 and the drive ring 230 are connected via a helical spring (not shown) so that the drive ring 230 urges the pins 228 into positions, which are closer to the centre of the annular chuck 220.

Two permanent magnets 233 are mounted to the tooth gear ring 230. A plurality of at least twenty-four rotor magnets 285, which are permanent magnets, are evenly arranged around the chuck base body 221. These rotor magnets 285 are part of the drive and bearing unit namely part of the rotor (elements of the active bearing), which is mounted to the chuck base body 221.

The plurality of rotor magnets 285 and the drive ring 230 carrying the permanent magnets 233 are encapsulated in a hollow annular space provided by the chuck base body 221, outer lower chuck cover 222, and the rotor magnet cover 229. Such rotor magnet cover 229 can be a stainless steal jacket. The covers 222 and 229 are annular and concentric with the chuck base body 221.

When assembling the chuck 220 the pin shafts 227 are inserted from above into their respective seats so that the pin shafts tightly seal against the chuck base body 221 as shown in FIG. 2f. Each pin shaft 227 is fixed in their position with a screw 224. Additionally each pin shaft may be pressed into its seat by a helical spring between the pin shaft and the screw.

Attached to the stator base plate 205 is the stator and active bearing unit 280 which is concentrically arranged with respect to the cylindrical wall 260. The bearing unit 280 corresponds with the rotor magnets 285 therefore levitating, bearing and rotating the chuck 220.

Below the active bearing unit 280 there are two pneumatic cylinders 250 mounted to the stator base plate 205. On the distal ends of the rods of the pneumatic cylinders 250 locking magnets 255 (permanent magnets) are arranged. The locking magnets correspond to the permanent magnets 233 of the drive ring 230. The pneumatic cylinders 250 are arranged so that the locking magnets 255 can be radially moved with respect to the axis of the cylindrical wall 260.

When the pins shall be opened e.g. to release a wafer the following procedure is conducted. The stator base plate 205 is lifted and therewith the levitating chuck 220 so that the cylindrical wall 260 is no longer in the gap between the locking magnets 255 and the chuck 220 (see FIG. 2e). Thereafter the pneumatic cylinders 250 move the locking magnets 255 in close proximity to the chuck 220 and the chuck is turned so that the permanent magnets 233 and therewith the drive ring 230 is locked by the locking magnets. Now the chuck is turned while the drive ring stands still and thus the pins 228 open. Alternatively the chuck base body might stand still while the pneumatic cylinders are moved so that the locking magnets tangentially turn (along the circumference of the chuck), whereby the drive ring is turned.

With reference to FIG. 1a-1f if the operation of the pin opening mechanism shall be described. The FIG. 1a-1f are schematic views of a cross-section along about a plane I-I as shown in FIG. 2c.

Figure 1A:
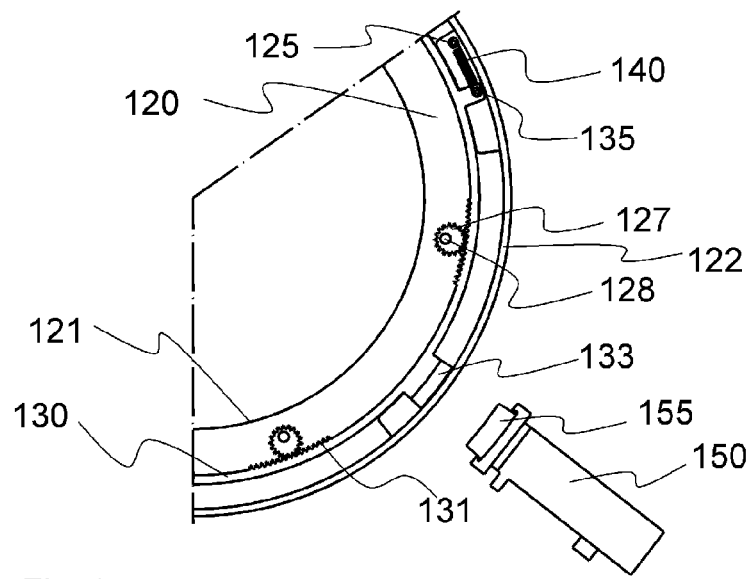
FIG. 1a-1f show a schematic top view of a device according to one embodiment of the invention in operation.
Figure 1B:
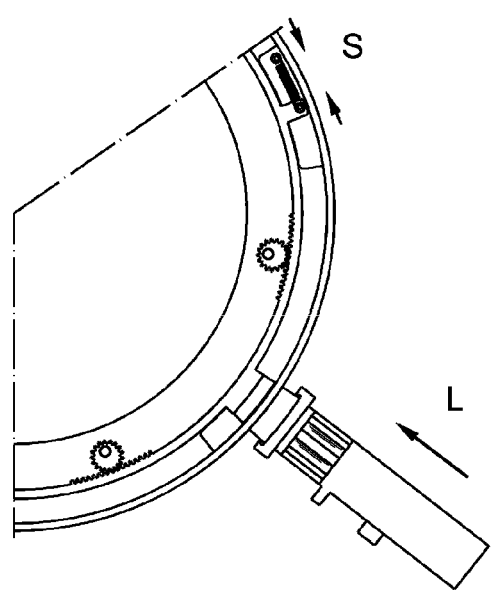
Figure 1C:
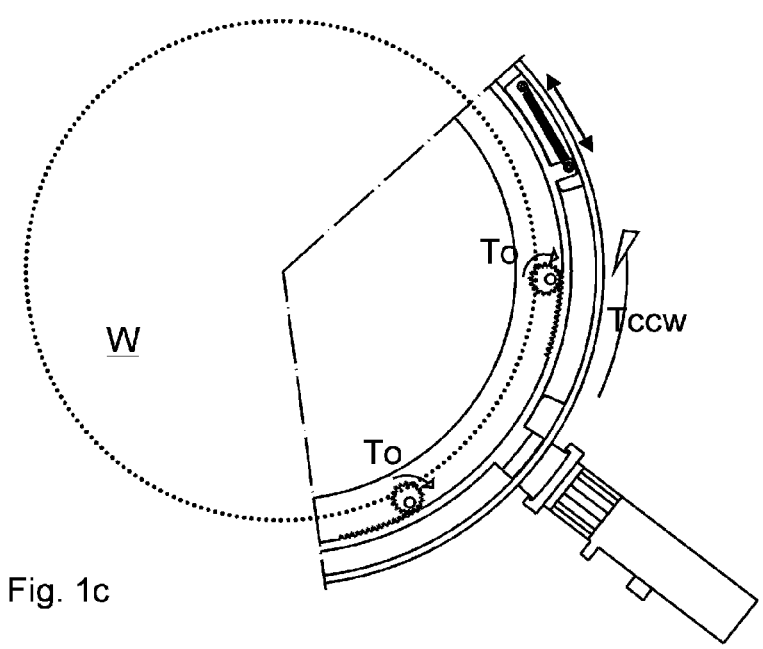
Figure 1D:
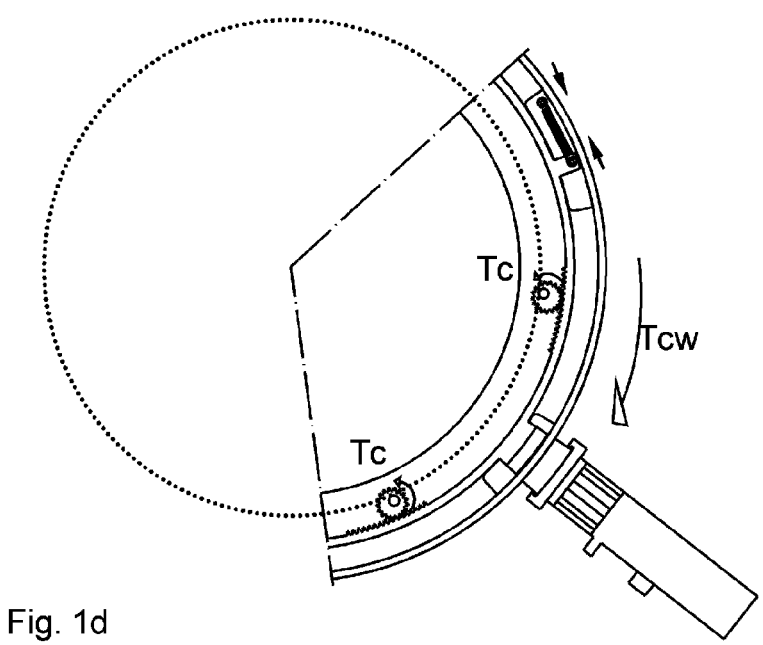

FIG. 1a shows the device in a standby position. Herein a 120°-segment of the device is shown. The chuck 120 with a chuck base body 121 and an outer wall 122 accommodate the tooth gear ring 130. The gear ring 130 has inwardly viewing teeth 131. The pin shafts 127 with the pins 128 are arranged so that their gears bite on the teeth 131 of gear ring 130 (drive ring). The pin shafts sit in their respective seats of the chuck base body 121.

The chuck base 121 and the drive ring 130 are connected via a helical spring 140 so that the drive ring 130 urges the pins 128 in a position, which is closest to the centre of the annular chuck 120. The force of the helical spring 140 is visualized by the two small arrows S in FIG. 1b. Around the circumference there are three such helical springs 140 arranged, which are mounted to the chuck base body 120 at mounting point 125 and to the gear ring at mounting point 135.

Locking magnets 155 are fixed to the distal end of the pneumatic cylinder 150. The Locking magnets 155 correspond to the permanent magnets 133 of the gear ring 130.

For opening and closing the pins e.g. to grab and release a wafer the following procedure is conducted. The levitating chuck 120 is lifted so that the cylindrical wall 160 (shown in FIG. 1e) is no longer in the gap between the locking magnets 155 and the chuck 120. Therefore the cylindrical wall is not shown in FIG. 1a-1d and FIG. 1f. Thereafter the chuck 120 is turned so that the permanent magnets face the locking magnets 155 (FIG. 1a).

Then the pneumatic cylinders 150 move (see arrow L) the locking magnets 155 in close proximity to the chuck 120 (see FIG. 1b), however without touching the chuck 120, so that the permanent magnets 133 and therewith the drive ring 130 is locked by the locking magnets.

Now the chuck 120 is turned counter-clockwise (Tccw) while the drive ring 130 stands still and thus the pin shaft turns clockwise (To) and the pins 128 open (FIG. 1c), while the helical springs 140 are expanded. A wafer W (dotted line) is placed between the pins.

Then the chuck base body 121 is turned clockwise (see FIG. 1d) and the pin shafts turn counter-clockwise (Tc) so that the pins move towards the centre and the pins securely hold the wafer W. The helical springs 140 ensure this closed position.

Figure 1E:
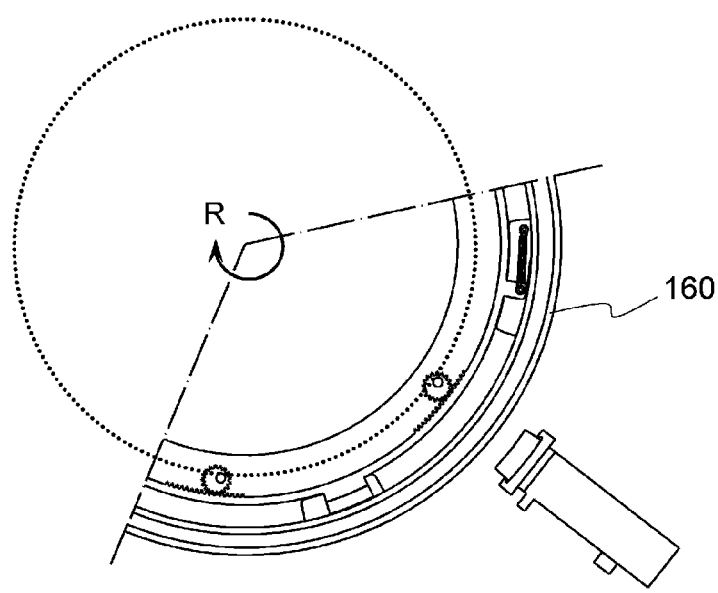
Figure 1F:
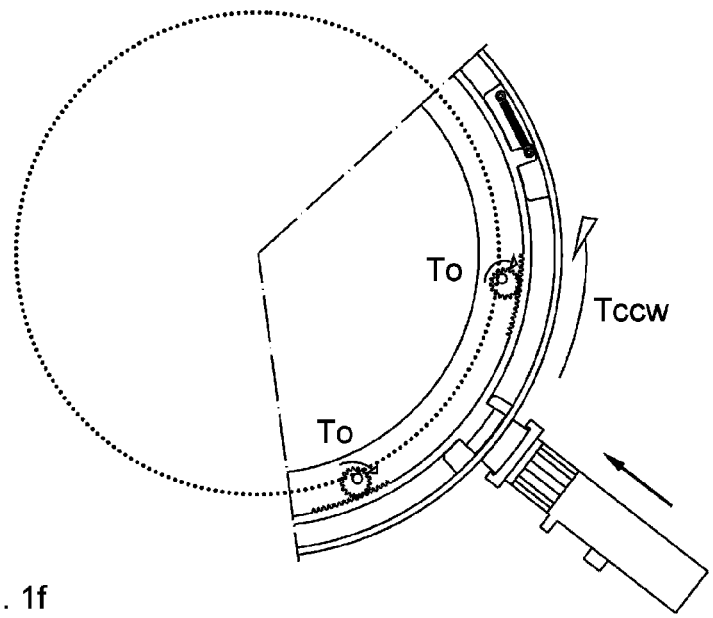

Thereafter the locking magnets are withdrawn, and the stator (not shown) is lowered with the chuck 120 so that the cylindrical chamber wall 160 surrounds the chuck (see FIG. 1e). Thereafter the chamber cover is lowered and thus the chamber is sealed. The process is started, meaning that the chuck rotates and different liquids in a sequence are dispensed from above and below.

After the process the chamber is opened again and the stator is lifted again. For releasing the wafer the locking magnets 155 are brought in close proximity to the chuck. The chuck is turned counter clockwise (Tccw) so that the pins open (To; see FIG. 1f).

Figure 3A:
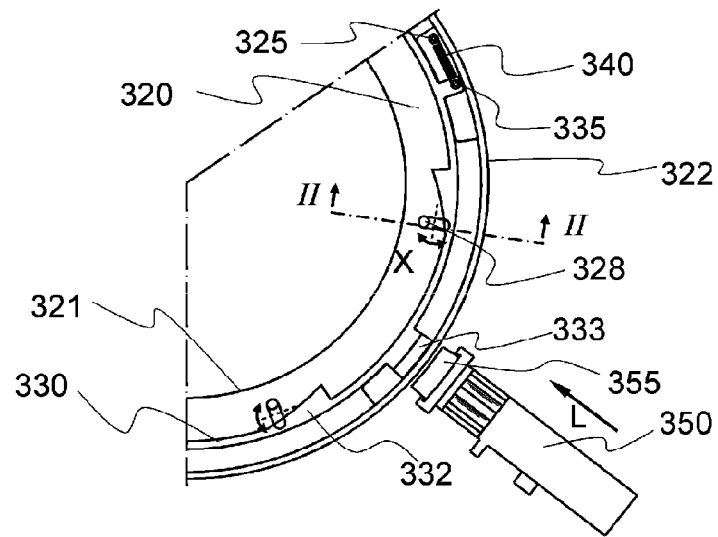
FIG. 3a-3c show another embodiment of the invention.
Figure 3B:
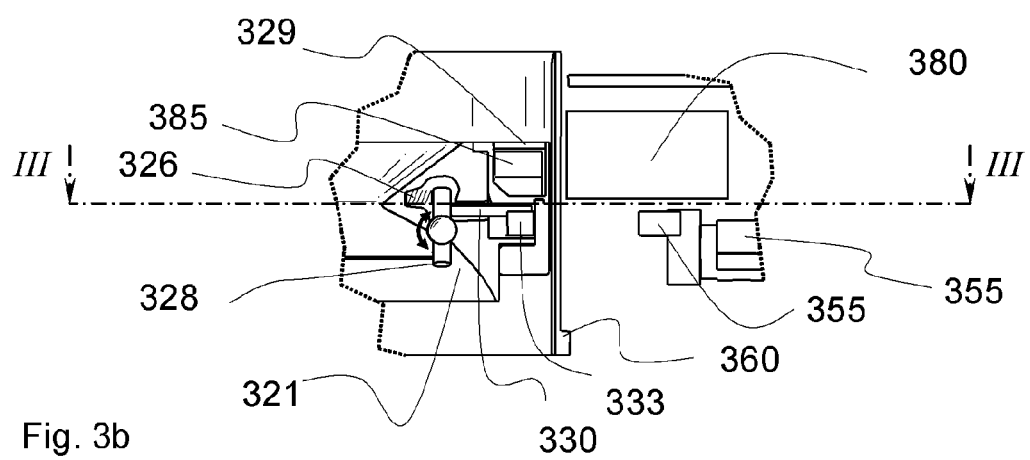

FIGS. 3a and 3b show another embodiment of the invention. FIG. 3b shows a cross-sectional view along the plane II-II (see FIG. 3a). FIG. 3a shows a cross-sectional view along the plane III-III (see FIG. 3b). In FIG. 3a a 120°-segment of the device is shown. The chuck 320 with a chuck base body 321 and an outer wall 322 accommodate the drive ring 330 with inwardly viewing slanted plane 332. The pins 328 are tiltable arranged so that they can tilt about an axis X in order to move one end of the pin toward and from the centre of the wafer. The axis X is parallel to a tangent of the wafer W so perpendicular to the plane II-II. The pin bearing may have a spherical shape and sits in its respective spherical seat of the chuck base body 321. Such seats serve also as sealing. For each pin a helical pressure spring 326 (pin closing springs) is provided to urge the pin in closed position. In this way the part of the pin located within the annular space of the chuck is kept in contact to the corresponding slanted plane 332 of the drive ring 330.

The chuck base 321 and the drive ring 330 are connected via a helical spring 340 so that the drive ring 330 allows the distal ends of the pins 328 in a position, which are closest to the centre of the annular chuck 320. Around the circumference there are three such helical springs 340 arranged, which are mounted to the chuck base body 320 at mounting point 325 and to the gear ring at mounting point 335.

The force of all pin closing springs 326 together can be selected strong enough so that the expansions springs 340 may be omitted or even such springs may be arranged to urge the drive ring into the opposite direction so that the slanted planes 332 may keep contact with the pins even if the pins grip a wafer on their distal ends.

Locking magnets 355 are fixed to the distal end of the pneumatic cylinder 350. The Locking magnets 355 correspond to the permanent magnets 333 of the gear ring 330.

Figure 3C:
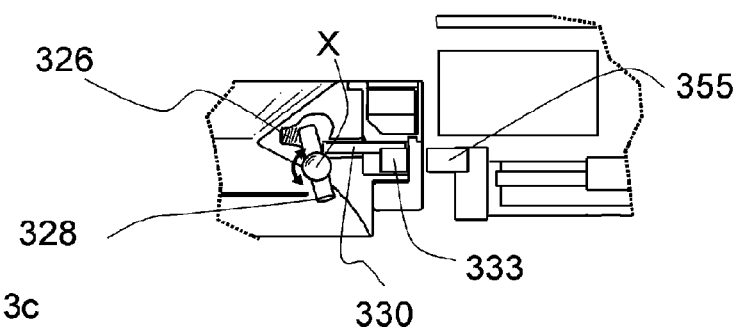

For opening and closing the pins e.g. to grab and release a wafer the following procedure is conducted. The levitating chuck 320 is lifted so that the cylindrical wall 360 (shown in FIG. 3c) is no longer in the gap between the locking magnets 355 and the chuck 320. Therefore the cylindrical wall is not shown in FIGS. 3a and 3c. Thereafter the chuck 320 is turned so that the permanent magnets face the locking magnets 355 (FIGS. 3a and 3c).

Then the pneumatic cylinders 350 move the locking magnets 355 in close proximity to the chuck 320, however without touching the chuck 320, so that the permanent magnets 333 and therewith the drive ring 330 is locked by the locking magnets.

Now the chuck 320 is turned counter-clockwise (Tccw) while the drive ring 330 stands still and thus the pins are tilted about the axis X and the pins 328 open (FIG. 3c), while the helical tension springs 340 and are expanded and the helical compression springs 326 are compressed. A wafer W (dotted line) is placed between the pins. Then the chuck base body 321 is turned clockwise (see FIG. 1d) and the pins are tilted so that the pins move towards the centre and the pins securely hold the wafer W. The helical pin springs 326 ensure this closed position.

The further procedure is analogous to what is described with reference to FIG. 1a-1f.

The invention claimed is:

1. A device for treating a disc-like article with a fluid, the device comprising:
    at least one dispenser for dispensing a fluid onto a disc-like article and a chuck for holding and rotating a disc-like article about an axis A perpendicular to the disc-like article, the chuck comprising a base body and gripping members for contacting the disc-like article at its edge,
    wherein the gripping members are radially movable with respect to the axis A,
    wherein the gripping members extend downwardly from an obliquely-inclined radially-inwardly facing annular surface of the base body, and
    wherein said obliquely-inclined surface surrounds the gripping members and extends downwardly to a level lower than a disc-like article when held by the gripping members.

2. The device according to claim 1, wherein the radial movement of the gripping members is driven by a drive ring, wherein the drive ring is rotatably mounted to the base body, so that the drive ring is rotatable against the base body around the axis A and thereby driving the gripping members, wherein the relative rotational movement of the drive ring against the base body is carried out by either holding the base body and rotating the drive ring or by holding the drive ring and rotating the base body, wherein the to-be-held-part (drive ring or base body) is held without touching the respective to-be-held-part by magnetic force.

3. The device according to claim 2, wherein the to-be-rotated part (base body or driving ring respectively) is rotated by magnetic force without touching the respective to be rotated part.

4. The device according to claim 2, wherein the base body is formed as a hollow ring with an annular chamber and where the drive ring is accommodated within the annular chamber.

5. The device according to claim 1, wherein the chuck is freely levitated by a magnetic bearing.

6. The device according to claim 1, wherein the chuck is levitated and rotated by an active magnetic bearing or a bearing supported by high temperature superconducting magnets.

7. The device according to claim 1, wherein the device further comprises a wall surrounding the chuck and during treating the disc-like article the chuck is freely levitated within the wall.

8. The device according to claim 7, wherein the wall surrounding the chuck is part of a closed chamber.

9. The device according to claim 1, wherein plural dispensers are provided for unobstructed dispensing of fluids onto both sides of the disc-like article.

10. A device for treating a disc-like article with a fluid, the device comprising:
- at least one dispenser for dispensing a fluid onto a disc-like article and a chuck for holding and rotating a disc-like article about an axis A perpendicular to the disc-like article, the chuck comprising a base body and gripping members for contacting the disc-like article at its edge,
- wherein the gripping members are radially movable with respect to the axis A,
- wherein the gripping members extend downwardly from an obliquely-inclined radially-inwardly facing annular surface of the base body,
- wherein the radial movement of the gripping members is driven by a drive ring, wherein the drive ring is rotatably mounted to the base body, so that the drive ring is rotatable against the base body around the axis A and thereby driving the gripping members, wherein the relative rotational movement of the drive ring against the base body is carried out by either holding the base body and rotating the drive ring or by holding the drive ring and rotating the base body, wherein the to-be-held-part (drive ring or base body) is held without touching the respective to-be-held-part by magnetic force, and
- wherein the drive ring is a gear ring and the gripping members are cams each eccentrically mounted to a respective smaller gear that is in meshing engagement with the gear ring.

11. A device for treating a disc-like article with a fluid, the device comprising:
- at least one dispenser for dispensing a fluid onto a disc-like article and a chuck for holding and rotating a disc-like article about an axis A perpendicular to the disc-like article, the chuck comprising a base body and gripping members for contacting the disc-like article at its edge,
- wherein the gripping members are radially movable with respect to the axis A,
- wherein the gripping members extend downwardly from an obliquely-inclined radially-inwardly facing annular surface of the base body,
- wherein the radial movement of the gripping members is driven by a drive ring, wherein the drive ring is rotatably mounted to the base body, so that the drive ring is rotatable against the base body around the axis A and thereby driving the gripping members, wherein the relative rotational movement of the drive ring against the base body is carried out by either holding the base body and rotating the drive ring or by holding the drive ring and rotating the base body, wherein the to-be-held-part (drive ring or base body) is held without touching the respective to-be-held-part by magnetic force, and
- wherein the drive ring is held in standby position by an elastic member, whereby the gripping members are urged into closed position.

\* \* \* \* \*